United States Patent [19]

Grabbe

[11] Patent Number: 5,062,802

[45] Date of Patent: Nov. 5, 1991

[54] CONTACT MODULE FOR A LOW HEIGHT MULTI-CHIP CARRIER SOCKET

[75] Inventor: Dimitry G. Grabbe, Middletown, Pa.

[73] Assignee: AMP Incorporated, Harrisburg, Pa.

[21] Appl. No.: 608,122

[22] Filed: Nov. 1, 1990

[51] Int. Cl.⁵ .............................................. H01R 9/09
[52] U.S. Cl. ...................................... 439/72; 439/525; 29/842
[58] Field of Search ...................... 439/70, 71, 72, 73, 439/330, 331, 892, 893, 62, 68, 83, 525, 526; 29/829, 830, 842, 846

[56] References Cited

U.S. PATENT DOCUMENTS

| | | | |
|---|---|---|---|
| 3,993,384 | 11/1976 | Dennis et al. | 439/71 |
| 4,395,084 | 7/1983 | Conrad | 439/331 |
| 4,445,736 | 5/1984 | Hopkins | 439/71 |
| 4,699,593 | 10/1987 | Grabbe et al. | 439/71 |
| 4,872,845 | 10/1989 | Korsunsky et al. | 439/70 |

Primary Examiner—Neil Abrams
Assistant Examiner—Nguyen, Khiem
Attorney, Agent, or Firm—James M. Trygg

[57] ABSTRACT

A contact module and method for making a connector for socketing an IC chip carrier is disclosed. The contact module comprised a relatively short body containing a plurality of contacts arranged on a standard center to center spacing, and a locking member. A positioning plate is fabricated having features, such as holes, along its edges for receiving other features, such as projections, formed in the contact modules. A number of the contact modules are assembled to the positioning plate to correspond to a particular chip carrier configuration. The plate and contact modules are then aligned with the pads of a substrate and terminal portions of the contacts are then soldered to the pads. The positioning plate is then removed. The chip carrier is then placed in the connector formed by the contact modules and a locking member inserted into each contact module for contacting the chip carrier leads.

21 Claims, 9 Drawing Sheets

CONTACT MODULE FOR A LOW HEIGHT MULTI-CHIP CARRIER SOCKET

This invention relates to sockets for integrated circuit chip carriers having flexible leads and, more particularly to a low height chip carrier socket for electrically connecting a multi-chip carrier to conductors on a substrate.

Figure 1:
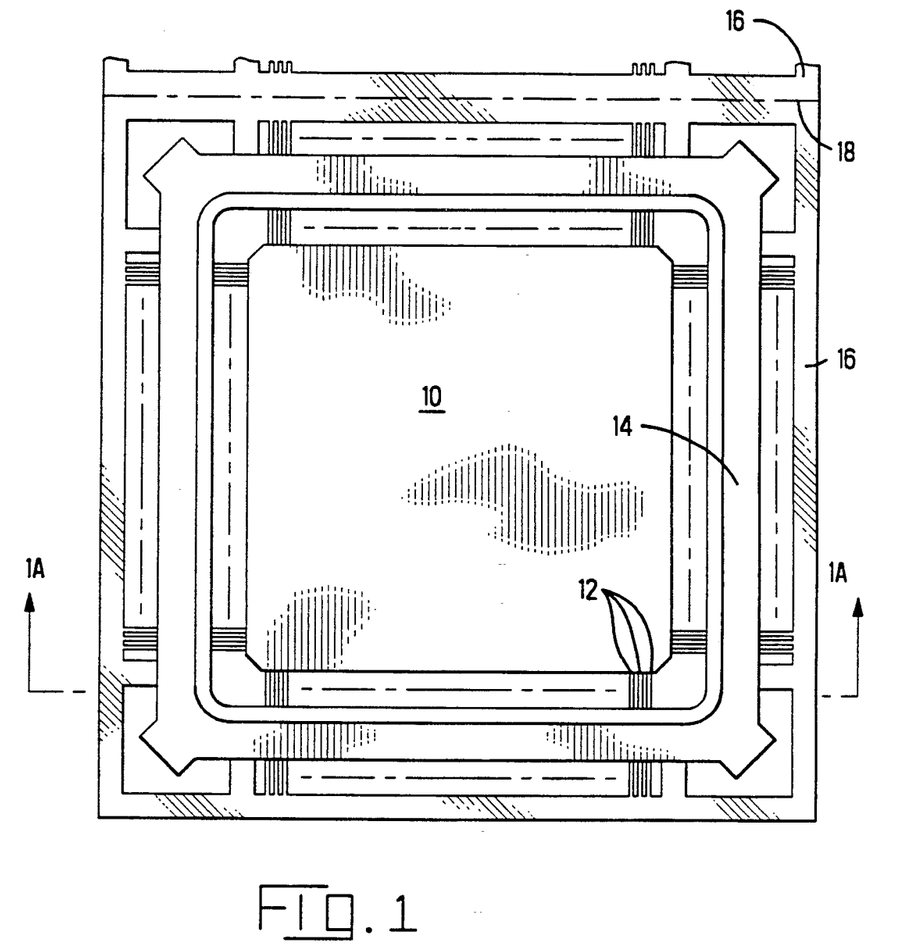
FIG. 1 is a plan view of the Tap-Pak structure showing an integrated circuit chip carrier.
Figure 1A:
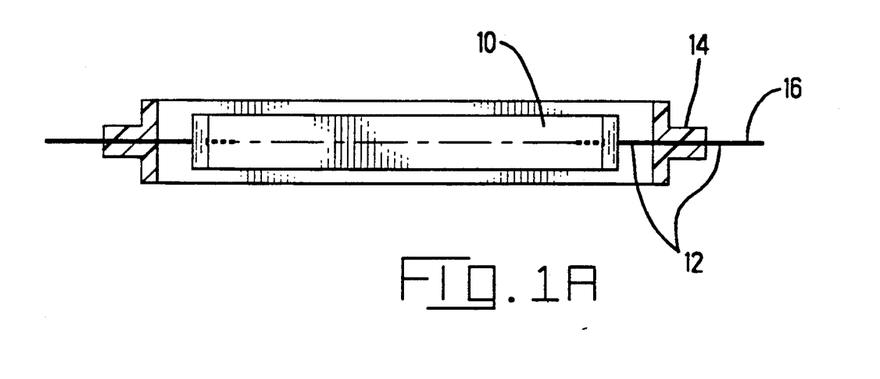
FIG. 1A is a cross-sectional view taken along the lines 1A—1A of FIG. 1.

The present invention pertains to the packaging technology for integrated circuit chips generally known in the industry as "Tape Pak". This technology involves attaching the chip to a lead frame in the usual manner, including wire bonded interconnections, and then molding a plastic carrier body which completely surrounds the chip with the leads of the lead frame extending outwardly from the sides of the body. A rectangularly shaped ring of plastic is also molded to completely surround but be spaced from the sides of the carrier body in the plane of the leads, the leads extending through the sides of the ring. Such a structure, shown in FIGS. 1 and 1A, includes a chip carrier 10 having a plurality of leads 12 extending outwardly from the four sides of the carrier 10 and through the sides of a ring 14. The lead frame 16 and the leads 12 are stamped or etched from a thin sheet of copper or other suitable material in a manner that is well known in the industry. The thickness of the material is usually about 0.005 inches and the width of the leads is typically 0.010 inches or less. Typically, several lead frames 16 are formed end to end in a strip, as shown in FIG. 1, so that several IC carrier packages can be formed simultaneously. After molding they are separated by shearing, for example, along the line 18.

Figure 2:
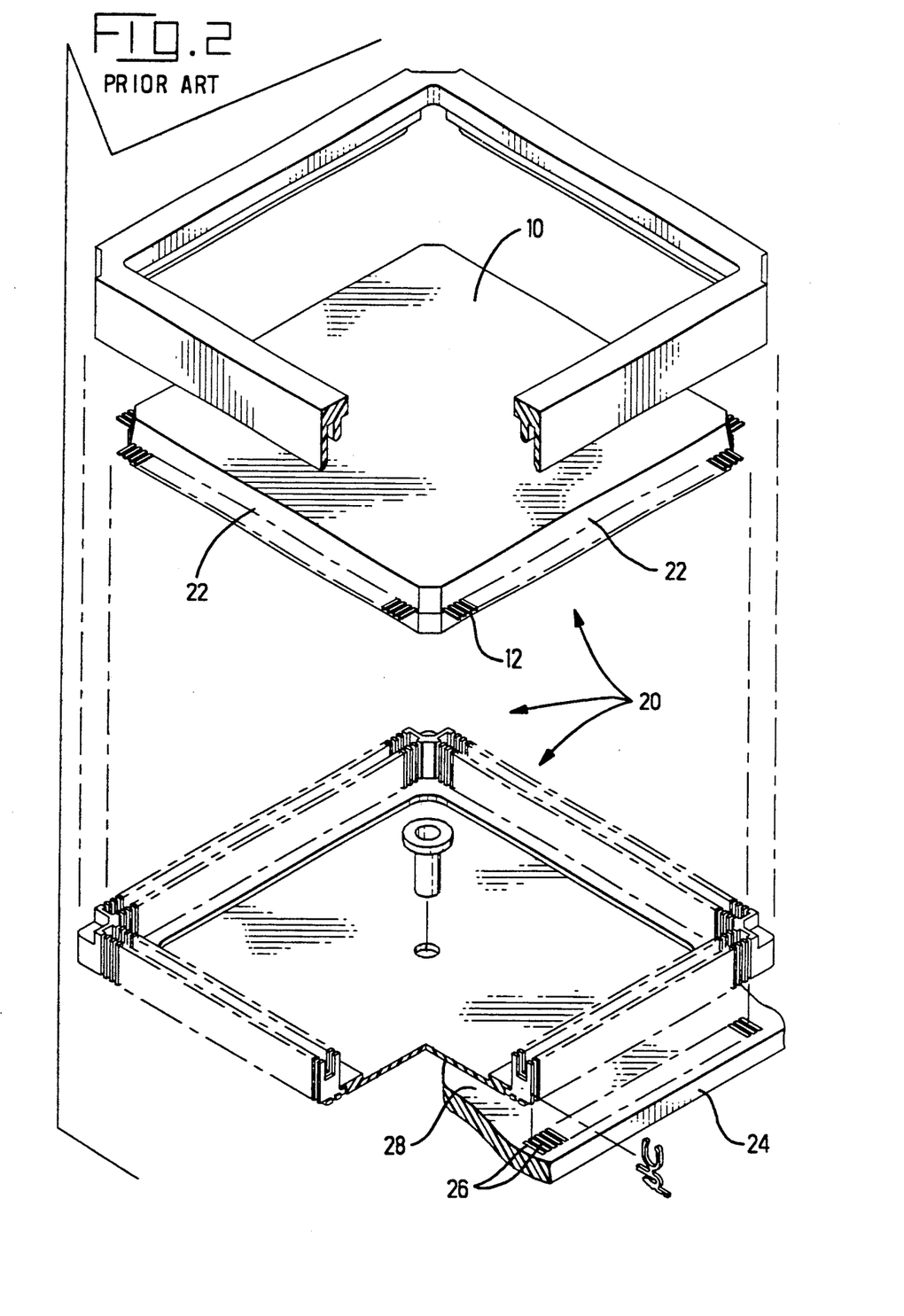
FIG. 2 is an isometric view showing the chip carrier of FIG. 1 in relation to a prior art socket.

A low height chip carrier socket for such a chip carrier is set forth in my copending patent application Ser. No. 07/431,519, which carries attorney's docket number 14678, was filed on Nov. 3, 1989, and is hereby incorporated by reference as though set forth verbatim herein. That chip carrier socket is shown in FIG. 2 and illustrates an integrated circuit chip carrier socket 20 for socketing the chip carrier 10. The chip carrier 10, in the present example, has relatively short leads 12 projecting outwardly from the edges 22. The leads 12 are spaced apart and are substantially flat and straight after being severed from the ring 14 shown in FIG. 1. A substrate or printed circuit board (PCB) 24 is shown having conductive pads 26 arranged in a rectangular pattern on a major surface 28 of the PCB 24. The purpose of the socket 20, of the present invention, is to interconnect the leads 12 with respective ones of the pads 26.

The trend in the industry is to provide much larger carriers for accommodating many integrated circuit chips which are logically interconnected on a substrate. Typically, a 4" carrier will have about 800 leads 12. The chip carrier socket 20 for socketing these large carriers is made of molded plastic with metal contact inserts. The plastic parts, of course, require a mold which can be quite expensive. Also, the time to design and build such molds can be lengthy, therefore, this multi-chip carrier socket can be very expensive where only a few sockets are needed. The present invention addresses this problem by providing standardized contact modules which can be arranged into any of several configurations for socketing a variety of different chip carriers. This obviates the need for a different mold for each different socket configuration.

SUMMARY OF THE INVENTION

The foregoing and additional objects are attained in accordance with the principles of this invention by providing a contact module for arranging with another similar contact module to form a connector socket for electrically connecting the leads of a component to respective pads on a substrate. Positioning means is provided for positioning the contact modules with respect to each other and to the pads. The contact module includes a body having a longitudinal axis or a plurality of laterally formed slots. A plurality of contacts is provided, one for each slot and arranged for electrically connecting some of said leads to respective pads, a terminal portion of each contact electrically engages a respective pad. A locking means is provided for urging each lead against the contacting portion of its respective contact. Means are included for engaging features on the positioning means for aligning the body therewith.

DESCRIPTION OF THE PREFERRED EMBODIMENT

Figure 3:
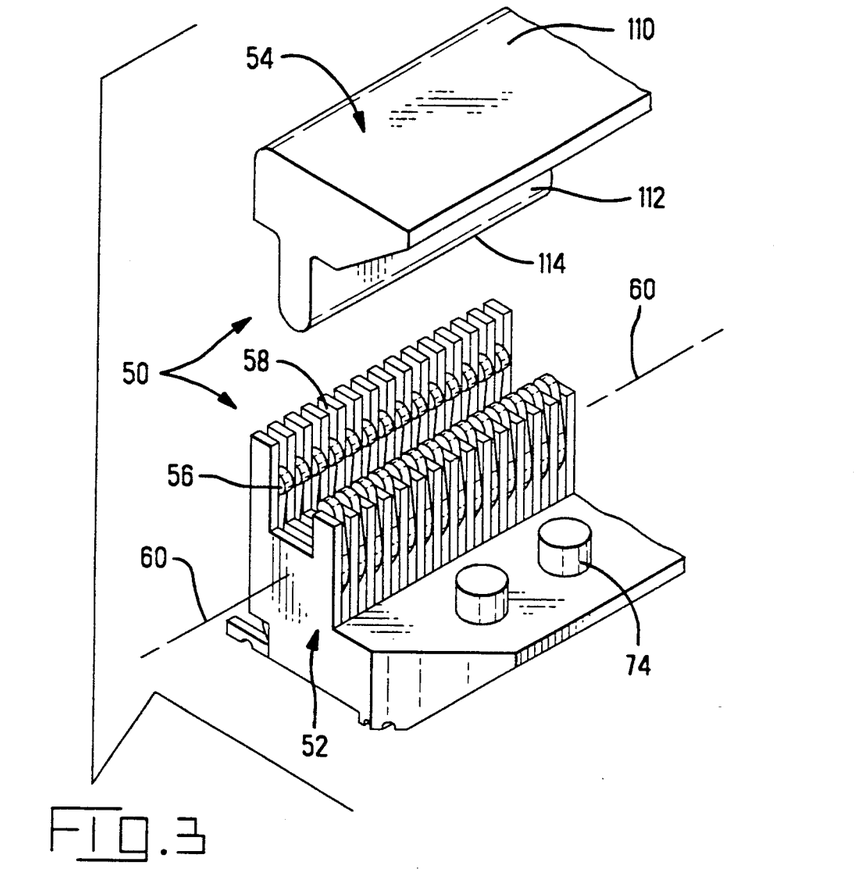
FIG. 3 is an isometric view showing the components of a contact module.
Figure 4:
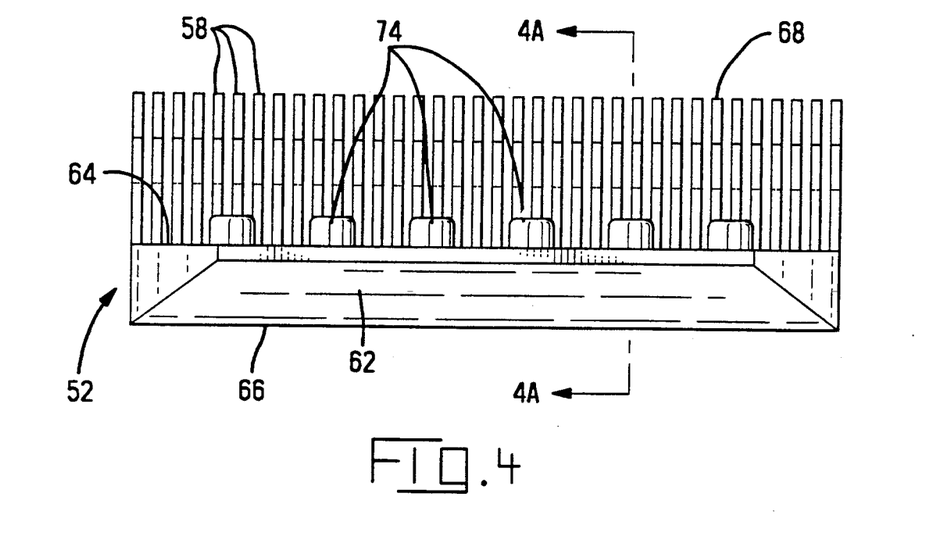
FIGS. 4 and 4A show a front view and an end view respectively of the body of the contact module.
Figure 4A:
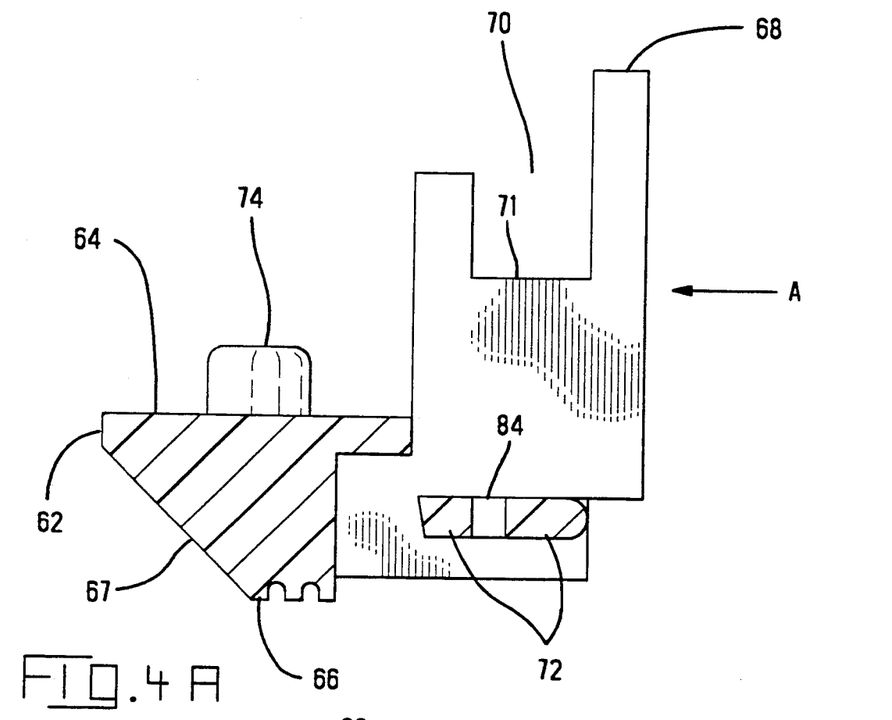

There is shown in FIG. 3 a connector module 50 having a body 52, a locking member 54, and a plurality of contacts 56 arranged in slots 58 formed in the body 52 lateral to its longitudinal axis 60. As best seen in FIGS. 4 and 4A, the body 52 includes a flange 62 having an upper surface 64 and a mounting surface 66, including a chamfer 67, and an upstanding wall 68. A longitudinal groove 70 having a bottom 71 is formed in the wall 68 for a purpose that will be discussed below. A plurality of the slots 58 are formed through the wall 68, as shown in FIG. 4, and are dimensioned to receive the contacts 56 therein. The slots 58, which may be as little as 0.005 of an inch wide to about 0.040 inch or more, depending on the width of the leads 12, are arranged to leave a bottom web 72 which interconnects the flange 62 and the remaining portions of the wall 68 for added strength. The slots 58 are arranged on a center to center spacing that matches that of the leads 12 of the chip carrier 10. A plurality of cylindrical shaped projections 74 extend from the surface 64 for a purpose that will be set forth below. The length of the body 52, in the present example, is 1.060 inch which permits 54 slots 58 spaced on 0.0196 inch centers. The exact length of the body 52 is somewhat arbitrary, however, it should be standardized to a convenient length.

Figure 5:
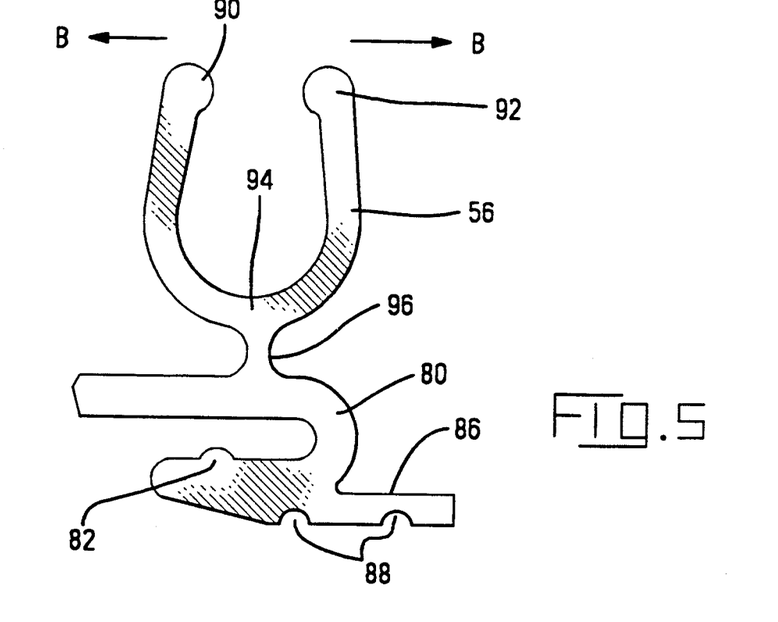
FIG. 5 shows the contact element.

The contact 56, as best seen in FIG. 5, is made of a single piece of flat sheet metal, such as copper alloy for example, having a thickness that is about the same as the width of the leads 12, about 0.085 of an inch in the present example. The contact 56 includes a U-shaped base 80 which is sized to closely slip over the web 72. A small protrusion 82 is formed on one of the inner surfaces of the U-shaped base 80 in a position to engage a hole 84 disposed in the web 72 so that as the contact 56 is inserted into the slot 58 in the direction of the arrow A of FIG. 4A, the U-shaped base snaps firmly into place about the web. A terminal 86 extends from one side of the U-shaped base 80 for engagement with a pad 26. A pair of openings 88 are provided in the pad engaging surface of the terminal 86 to provide space for solder to accumulate when the terminal is soldered to the pad. The contact 56 also includes a tuning fork portion projecting upwardly from the base 80 into the slot 58 which includes a contacting portion 90 and an opposed backup portion 97. The contacting portion 90 and backup portion 92 both project from a common bight 94 which is attached to the U-shaped base 80 through a pivotal zone 96. The pivotal zone 96 is a relatively narrow section which permits a small amount of pivotal movement of the tuning fork in the directions of the arrows B as shown in FIG. 5. The purpose of this pivotal zone 96 will be set forth below. The terminal 86 extends outwardly from the wall 68 to permit reflow soldering by a reflow heating tool, focused infrared radiation, hot gas reflow, or other such reflow techniques. This also permits optical inspection of the soldered terminal. As set forth above, the openings 88 in the pad engaging surface of the terminal 86 create a condition that is conducive to the formation of solder fillets thereby enabling the soldered interface to be stronger than it would otherwise be. Those skilled in the art will appreciate that the terminal 86, instead of being arranged for surface soldering, could be arranged to extend downwardly through a plated through hole, or the like, formed in the PCB 24 in a manner that is well known in the industry. In the present example where the terminals 86 are surface mounted, the body 52, containing the contacts 56 in the slots 58, is accurately positioned on the surface 28 of the PCB 24 so that the terminals 86 are in alignment with their respective pads 26, in a manner set forth below.

Figure 6:
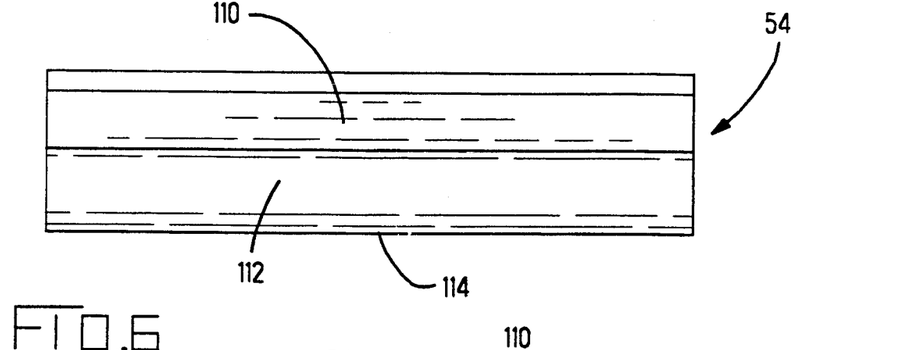
FIGS. 6 and 6A show a front view and an end view respectively of the locking member.
Figure 6A:
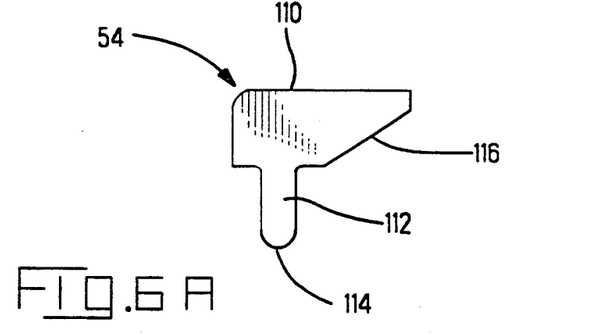
Figures 7, 7A:
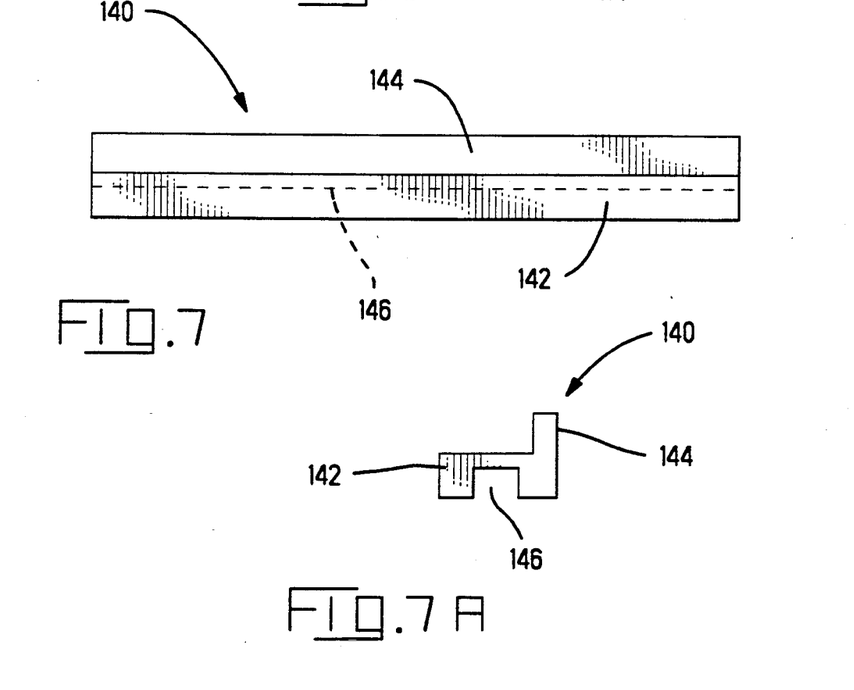
FIGS. 7 AND 7A show a front view and an end view respectively of the spacer member.

A locking member 54 is shown in FIGS. 6 and 6A having a top flange 110 and a rail 112 that projects downwardly. The rail 112 includes a rounded edge 114 along its entire length for a purpose that is set forth below. A bevel 116 is formed on the underside of one edge of the top flange 110 and provides a camming surface against which a tool may be wedged to help remove the locking member 54 from the groove 70 once it is assembled. The locking member 54 has a length substantially identical to that of the body 52 and may be cut from a continuous extrusion.

Figure 8:
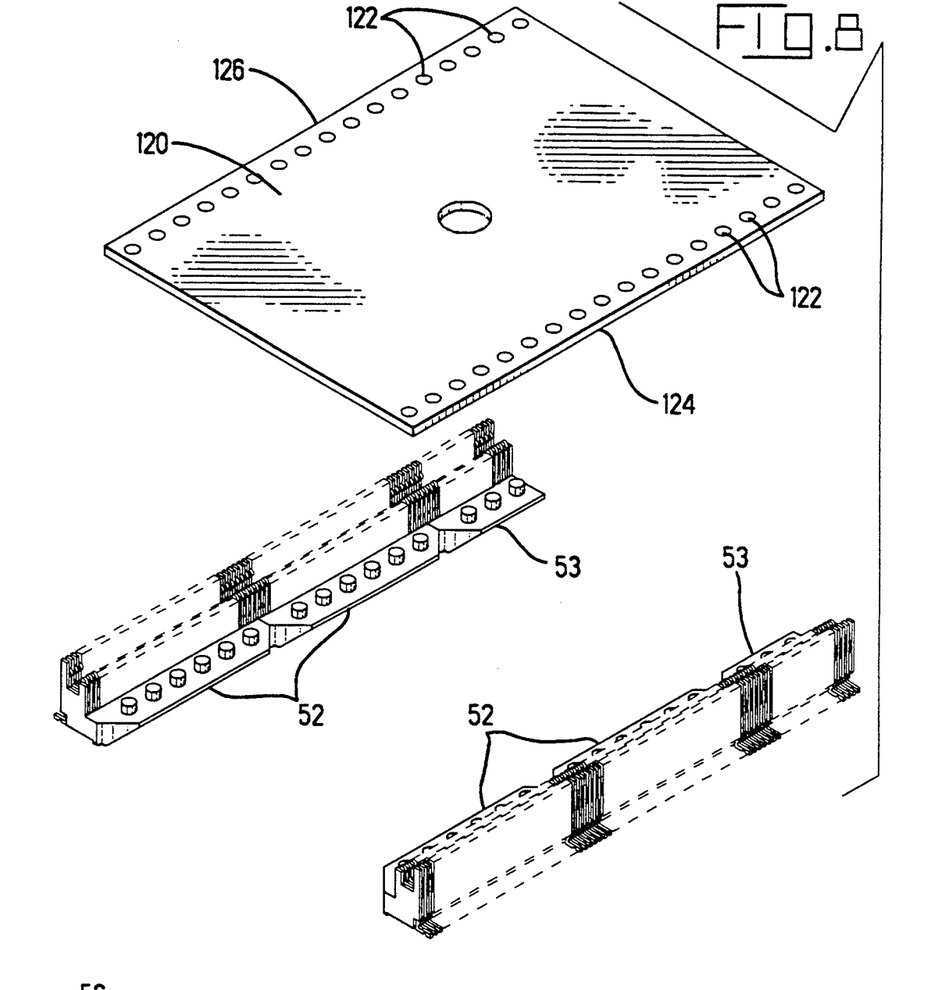
FIG. 8 is an isometric view showing the positioning plate and several contact modules prior to assembly.
Figure 9:
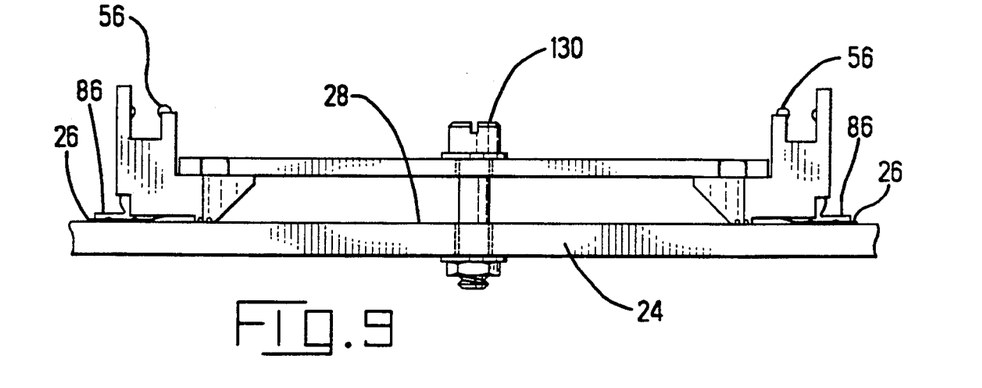
FIGS. 9, 10 and 11 are front views showing the contact modules in various stages of assembly to a substrate.

A single contact module 50 comprises a body 52 or portion 53 of a body 52, a plurality of contacts 56, one in each slot 58, and a locking member 54. The contact modules 50 are assembled into a connector for socketing the chip carrier 10 by means of a positioning plate 120 having openings 122 along at least one edge 124 or 126 thereof, as shown in FIG. 8. The openings are shaped to closely receive the projections 74 thereby accurately aligning the body 52 with the positioning plate 120 with no appreciable play. It will be understood that the projections 74, while of cylindrical shape in the present example, may be of any suitable shape, and the openings 122 also may be of any suitable shape. Further, rather than openings 122, the plate 120 may contain projections or other features along its edge and the body, rather than projections 74 may have openings or other features that will engage the features of the plate 120. The important requirement is that when the features of the body 52 operationally engage the features of the plate 120, the body is accurately aligned with the plate with no appreciable play. A number of contact modules 50, optionally including a module comprising portion 53 of a body 52, are positioned end to end, as shown in FIG. 8, to form an array of slots 58 having a one to one correspondence with an array of leads 12 along one side of the chip carrier 10. If the chip carrier 10 has an array of leads 12 projecting along another side thereof, then another grouping of contact modules 50 will be arranged end to end corresponding to the number of leads 12 present along that side. In the present example we will assume that leads 12 project from only two opposing sides of the chip carrier 10 and, therefore, require the two groups of contact modules 50 as shown in FIG. 8. Note that the portion 53 may be trimmed from a body 52 by severing with a sharp knife or other suitable means. Alternatively, the body 52 or portion 53 may be cut from a continuous extrusion. The contact modules 50 are then assembled to their respective edges 124,126 of the positioning plate 120 by bringing the projections 74 into engagement with their respective openings 122 so that the two groups of contact modules 50 are in accurate mutual alignment in direct correspondence with the leads 12 of the chip carrier 10. The positioning plate 120 along with its attached contact modules 50 is aligned with the substrate 24, by any suitable means, so that the terminals 86 of the contacts 56 are in registry with their respective pads 26. The plate 120 is then clamped to the substrate 24, for example by means of a screw fastener and nut assembly 130, as shown in FIG. 9. The terminals 86 are then soldered to their respective pads 26 either by solder reflow techniques as described above or by other suitable means. Other means for providing a low resistance contact between the terminals 86 and their respective pads 26 may include thermo-compression bonding or other suitable techniques. Once the terminals 86 are securely fastened to the substrate 24 by means of solder, the screw fastener and nut assembly 130 and the positioning plate 120 are removed. An adhesive material 65 such as epoxy or other suitable cement is applied to the chamfer 67 and adjacent portion of the substrate 24 to bond the contact modules 50 to the surface 28 of the substrate 24. This will substantially limit any strain that might otherwise be imposed upon the solder connections. Alternatively, the adhesive may be applied to the parts prior to assembly and then thermally cured after assembly.

Figure 10:
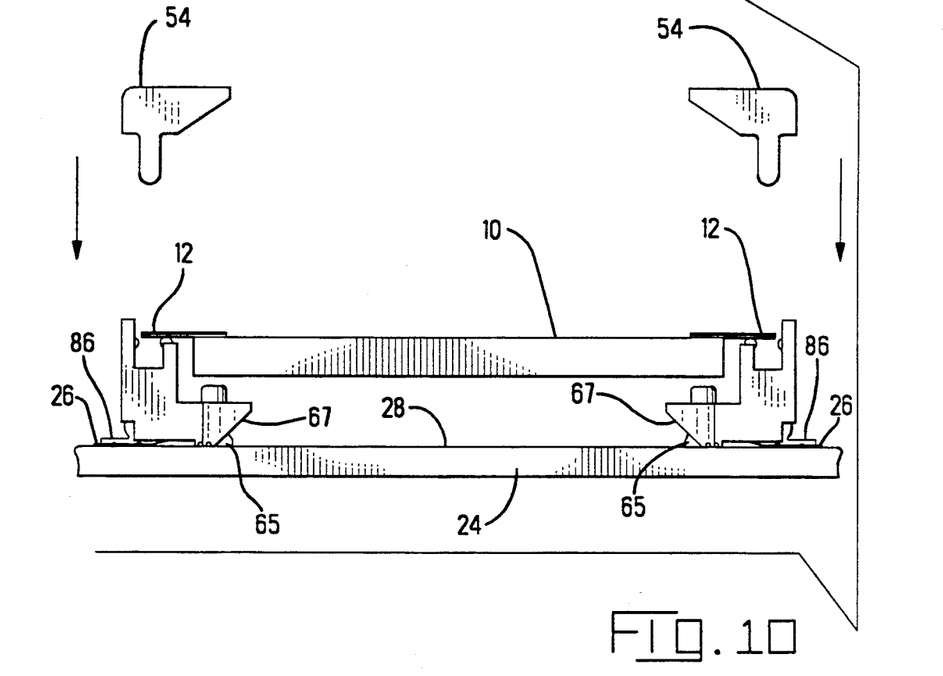
Figure 10A:
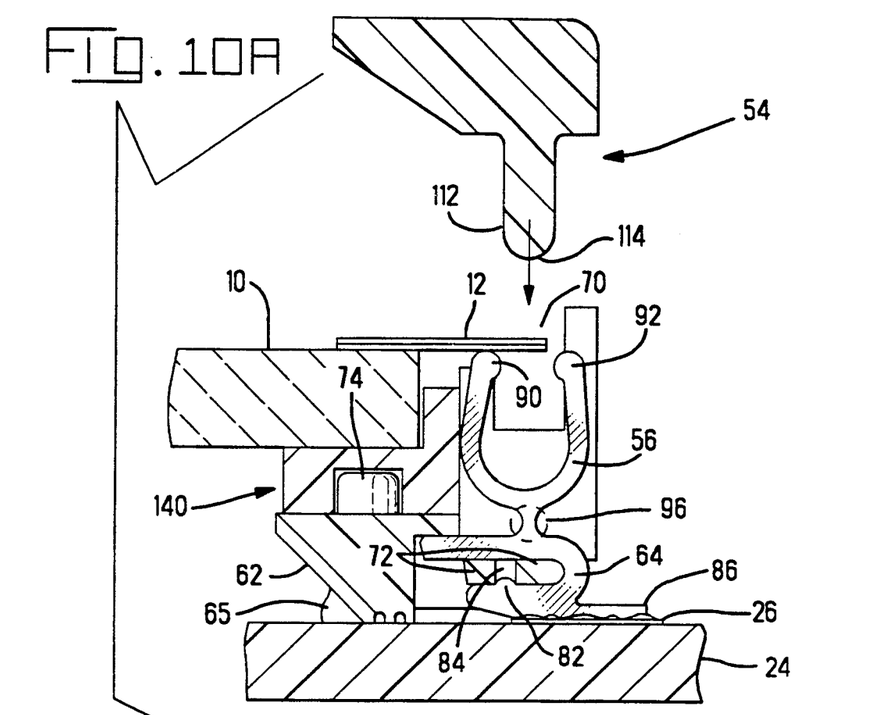
FIGS. 10A and 11A are enlarged cross-sectional views of portions of FIGS. 10 and 11 respectively.
Figure 11:
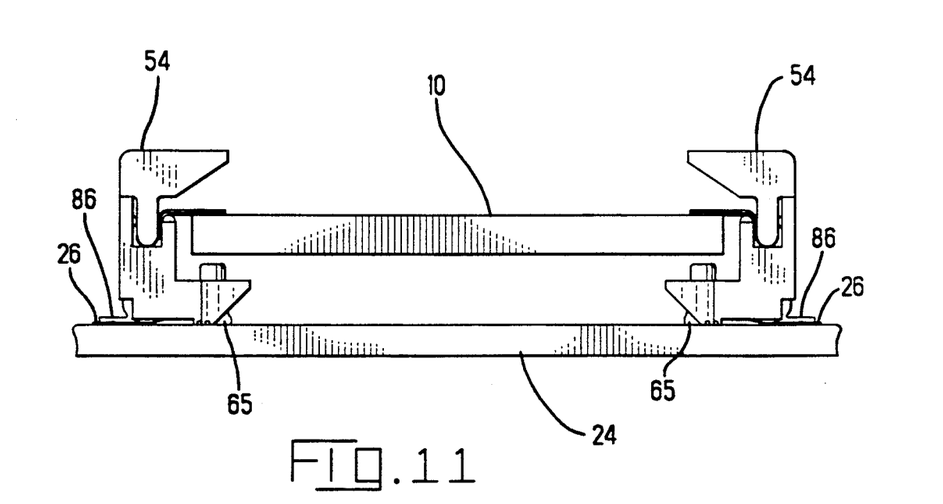
Figure 11A:
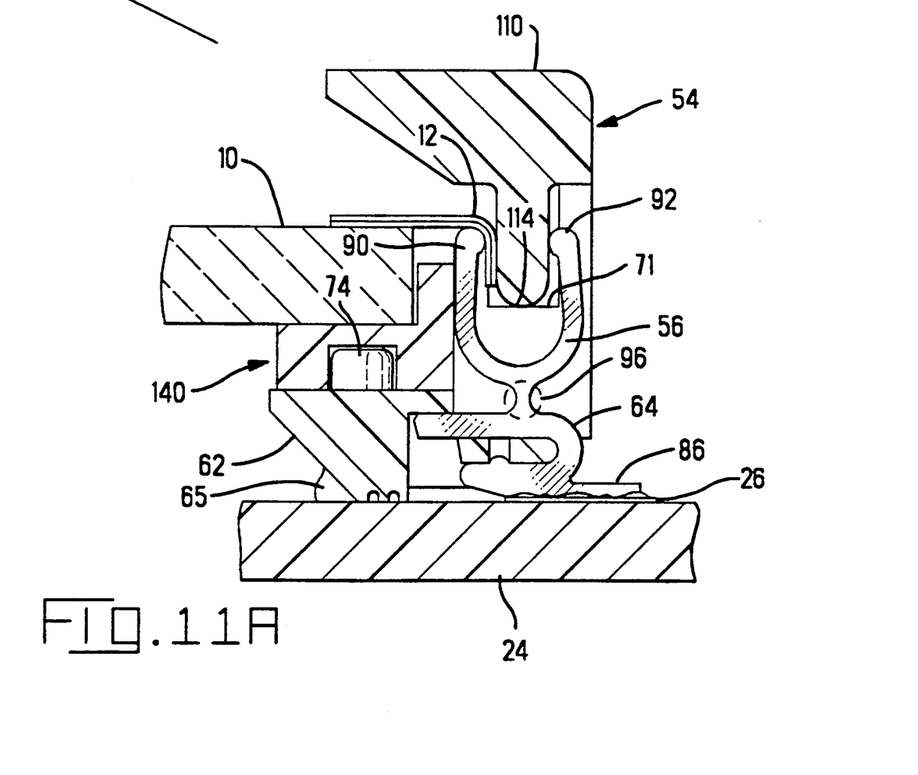

As shown in FIGS. 10 and 10A a chip carrier 10 is then positioned so that its leads 12 extend into respective slots 58 of the modules 50, the leads resting on top of the contacting portion 90. The locking member 54 for each module 50 is positioned, one at a time, above its respective module so that the rail 112 is in vertical alignment with the groove 70 as shown in FIGS. 10 and 10A. Where a module 50 has a body 53 that is shorter than the standard length, a locking member 54 is trimmed to the length of the body 53. The locking member 54 is then caused to move downwardly in the direction of the arrow C shown in FIG. 10A so that the rounded edge 114 engages the leads 12 and bends them downwardly about their respective contacting portions 90. Movement of the locking member 54 continues until the edge 114 engages the bottom 71 of the groove 70. At this point the lead 12 and rail 112 are wedged between the contacting portion 90 and the backup portion 92 as shown in FIGS. 11 and 11A. The stored energy in the tuning fork portion of the contact 56 maintains the contacting portion 90 in pressing electrical contact with its respective lead 12. The pivotal zone 96 will allow for slight variations in alignment of the parts.

A spacer member 140, shown in FIGS. 7, 7A, 10A, and 11A, is optionally provided to support the weight of the chip carrier 10 thereby relieving some strain from the leads 12. The spacer 140 includes a base 142 which rests on the surface 64 of the module 50, and an upwardly extending wall 144, when needed, which limits lateral movement of the chip carrier 10 during positioning of the leads 12 in the slots 58 and while bending the leads 12 about the contacting portions 90 of the contacts 56. A longitudinal groove 146 is provided in the bottom of the base 142 to provide clearance for the projections 74.

Figure 12:
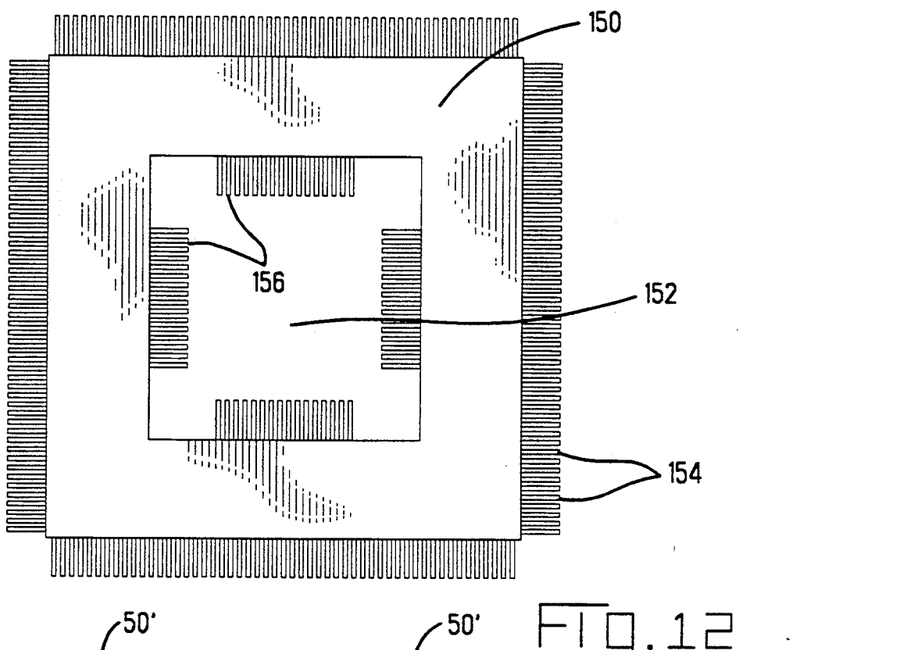
FIG. 12 is a plan view of an IC chip carrier having both outwardly and inwardly directed leads.
Figure 13:
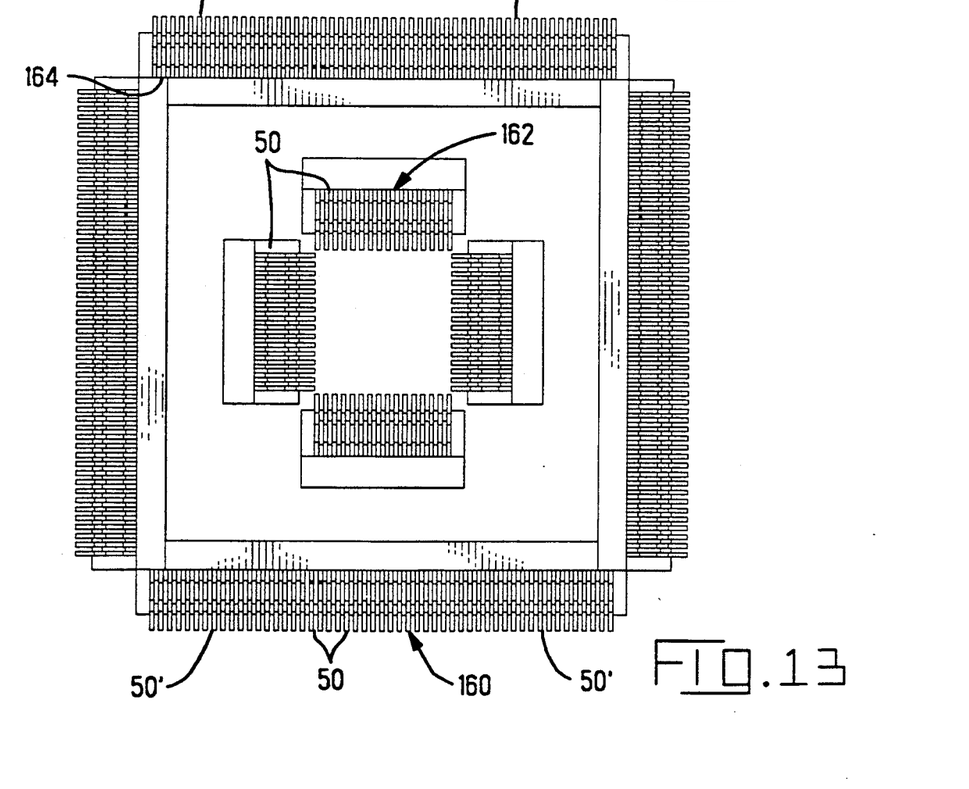
FIG. 13 is a plan view showing contact modules arranged to accept the chip carrier of FIG. 12.

As set forth above, the contact modules 50 may be used in various combinations including portions 53 of the body 52 to construct connectors for socketing large chip carriers having varying lead configurations. While the present example utilized a chip carrier having leads 12 projecting from two opposite sides thereof, the teachings of the present invention may be advantageously practiced with chip carriers having leads projecting from one side or several sides. Additionally, where edge space for leads is at a premium, the chip carrier may have an opening within its perimeter with leads facing inwardly. FIG. 12 shows such a chip carrier 150 having a central opening 152. A plurality of leads 154 project from the four outside edges and another plurality of leads 156 project from the four inside edges. FIG. 13 shows a connector for socketing the chip carrier 150 utilizing an outer set 160 of contact modules 50 and an inner set 162. Note that each corner module 50' may include a cutout 164 to permit closer spacing of adjacent corner leads. The cutout 164 may be of rectangular shape as shown in FIG. 13 or it may be a miter as shown in FIG. 8.

An important advantage of the present invention is that low height chip carrier sockets may be constructed in far less time than heretofore possible because there is no need for a mold. It is only necessary to fabricate a positioning plate for accurately aligning the contact modules of the present invention with the pads on a substrate. Additionally, the cost of such a socket is substantially lower because engineering design time is reduced and the cost of a mold for each different chip carrier configuration is eliminated.

I claim:

1. A contact module for arranging with another similar contact module to form a connector for electrically connecting the leads of a component to respective pads on a substrate, wherein the leads are spaced apart and projecting from a peripheral edge of the component, and wherein a positioning means is included for positioning both said contact module and said similar contact module with respect to said pads only during assembly of said modules in said forming of said connector, said positioning means being separable from said modules thereafter, comprising:
   (a) a body having a longitudinal axis and a plurality of slots formed lateral to said longitudinal axis;
   (b) a plurality of contacts, one for each of said slots and arranged for electrically connecting some of said leads to respective ones of said pads on said substrate, each said contact including a terminal portion arranged to electrically engage a respective said pad and a contacting portion arranged to electrically engage a respective said lead;
   (c) locking means for urging each said lead into pressing electrical contact with said contacting portion of a respective one of said contacts;
   (d) means for engaging features on said positioning means for aligning said body therewith.

2. The contact module according to claim 1 wherein said features on said positioning means comprise openings and said means for engaging said features comprise a plurality of projections on said body spaced so that some of said projections engage corresponding openings thereby aligning said body with said positioning means.

3. The contact module according to claim 2 wherein said projections are of cylindrical shape and are spaced in substantially a straight line.

4. The contact module according to claim 3 including a cutaway in at least one end of said body so that said contact module and said similar contact module can be positioned in close adjacent proximity.

5. The contact module according to claim 1 wherein each said contact includes a contacting portion and an opposed backup portion, and said locking means includes means for forming each said lead about said contacting portion of its respective contact.

6. The contact module according to claim 1 wherein each of said plurality of contacts includes an expandable structure means for storing energy when said locking means is wedged between a respective lead and backup portion so that the stored energy acts to effect said pressing electrical contact.

7. The contact module according to claim 1 wherein said locking means includes a wedging member having a camming surface for engaging and forming each said lead about its respective contacting portion when assembled to said body.

8. The contact module according to claim 1 wherein said body includes a bottom and an upstanding wall, a longitudinal groove being disposed in said wall normal to said plurality of slots and arranged to receive said wedging member so that when said wedging member is assembled to said body said camming surfaces will engage and form each said lead about its respective contacting portion.

9. In a method of making a socket for terminating a chip carrier having a plurality of leads extending outwardly from said carrier, wherein each said lead is electrically connected to a respective contact of said socket which in turn is electrically connected to a respective pad on a substrate, said socket comprising at least a first contact module and a second contact module, wherein a positioning plate is included for aligning and positioning said modules with respect to said pads, each said contact module comprising:

(a) a body having a longitudinal axis and a plurality of slots formed lateral to said longitudinal axis;

(b) a plurality of contacts, one for each of said slots and arranged for electrically connecting some of said leads to respective ones of said pads on said substrate, each said contact including a terminal portion arranged to electrically engage a respective said pad and a contacting portion arranged to electrically engage a respective said lead;

(c) a locking means for urging each said lead against said contacting portion of a respective one of said contacts;

(d) means for engaging features on said positioning plate for uniquely aligning said body therewith;

the steps comprising:

(1) providing a positioning plate having at least one edge and a plurality of features associated with said edge;

(2) assembling said first and second contact modules to said positioning plate so that said means for engaging of each module is in aligning engagement with respective ones of said features, said modules being in mutual alignment with said edge;

(3) aligning said positioning plate so that said terminal portion of each contact in said modules is in alignment with and close proximity to a respective one of said pads on said substrate;

(4) providing low resistance contact between each said terminal portion to its said respective pad; and (5) then removing said positioning plate.

10. The method according to claim 9 including the step:

applying adhesive to a junction of said modules and said substrate sufficient to secure said modules to said substrate.

11. The method according to claim 10 wherein said step of applying adhesive is performed after step (5).

12. The method according to claim 9 wherein said step of providing a low resistance contact includes soldering said terminal portions to their respective pads.

13. The method according to claim 9 including prior to step (2) the following step:

(1.1) cutting one of said first and second contact modules to a length corresponding to the length of its respective said edge of said positioning plate.

14. A connector for electrically connecting the leads of a component to respective pads on a substrate, wherein the leads are spaced apart and projecting from a peripheral edge of the component, said connector comprising:

at least two similar contact modules, wherein a positioning means is included for aligning and positioning said modules with respect to said pads only during assembly of sid modules into said connector, said positioning means being separable from said modules thereafter, each said module comprising:

(a) a body having a longitudinal axis and a plurality of slots formed lateral to said longitudinal axis;

(b) a plurality of contacts, one for each of said slots and arranged for electrically connecting some of said leads to respective ones of said pads on said substrate, each said contact including a terminal portion arranged to electrically engage a respective said pad;

(c) locking means for urging each said lead against said contacting portion of a respective one of said contacts;

(d) means for releasably engaging features on said positioning means for aligning said body therewith.

15. The connector according to claim 14 wherein said features on said positioning means comprise openings and said means for releasably engaging said features comprise a plurality of projections on said body spaced so that some of said projections engage corresponding openings thereby aligning said body with said positioning means.

16. The connector according to claim 15 wherein said projections are of cylindrical shape and are spaced in substantially a straight line.

17. The connector according to claim 16 including a cutaway in at least one end of said body so that said two similar contact modules can be positioned in close adjacent proximity.

18. The contact module according to claim 14 wherein each said contact includes a contacting portion and an opposed backup portion, and said locking means includes means for forming each said lead about said contacting portion of its respective contact.

19. The connector according to claim 14 wherein said locking means includes a wedging member having a camming surface for engaging and forming each said lead about its respective contacting portion when assembled to said body.

20. The connector according to claim 19 wherein said body includes a bottom and an upstanding wall, a longitudinal groove being disposed in said wall normal to said plurality of slots and arranged to receive said wedging member so that when said wedging member is assembled to said body said camming surfaces will engage and form each said lead about its respective contacting portion.

21. The connector according to claim 14 wherein said terminal portion of each of said contacts is arranged to be physically attaching to a respective pad to effect said assembly of said module into said connector.

* * * * *

UNITED STATES PATENT AND TRADEMARK OFFICE
CERTIFICATE OF CORRECTION

PATENT NO. : 5,062,802

DATED : November 5, 1991

INVENTOR(S) : Dimitry G. Grabbe

It is certified that error appears in the above-identified patent and that said Letters Patent is hereby corrected as shown below:

Claim 14, column 7, line 54, delete the word "sid" and insert the word --said--.

Signed and Sealed this

Thirteenth Day of April, 1993

Attest:

STEPHEN G. KUNIN

*Attesting Officer*     *Acting Commissioner of Patents and Trademarks*